(12) United States Patent
Utess et al.

(10) Patent No.: US 10,923,594 B2
(45) Date of Patent: Feb. 16, 2021

(54) METHODS TO REDUCE OR PREVENT STRAIN RELAXATION ON PFET DEVICES AND CORRESPONDING NOVEL IC PRODUCTS

(71) Applicant: GLOBALFOUNDRIES U.S. INC., Santa Clara, CA (US)

(72) Inventors: Dirk Utess, Dresden (DE); Peter Philipp Steinmann, Durham, NC (US); Stephanie Wilhelm, Dresden (DE)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 259 days.

(21) Appl. No.: 16/227,059

(22) Filed: Dec. 20, 2018

(65) Prior Publication Data

US 2020/0203530 A1   Jun. 25, 2020

(51) Int. Cl.
   *H01L 29/78*    (2006.01)
   *H01L 21/8234*  (2006.01)
   *H01L 27/088*   (2006.01)

(52) U.S. Cl.
   CPC .. *H01L 29/7843* (2013.01); *H01L 21/823481* (2013.01); *H01L 27/088* (2013.01)

(58) Field of Classification Search
   CPC ......... H01L 29/7843; H01L 21/823481; H01L 27/088
   See application file for complete search history.

(56) References Cited

U.S. PATENT DOCUMENTS

| | | | | |
|---|---|---|---|---|
| 2006/0113641 A1* | 6/2006 | Hohage | ........... | H01L 21/823412 257/640 |
| 2006/0113644 A1* | 6/2006 | Ridley | ................ | B81C 1/00698 257/673 |
| 2007/0296020 A1* | 12/2007 | Shiba | .................. | H01L 27/0207 257/315 |
| 2015/0187782 A1* | 7/2015 | Yamakoshi | ............ | G11C 16/10 257/321 |

(Continued)

OTHER PUBLICATIONS

Andrieu, SiGe Channel and Layout EFFETS: Basics Brochure, Cea Tech.
(Continued)

*Primary Examiner* — Lex H Malsawma
*Assistant Examiner* — Xia L Cross
(74) *Attorney, Agent, or Firm* — Hoffman Warnick LLC

(57) ABSTRACT

One illustrative integrated circuit product disclosed herein comprises first and second spaced-apart P-active regions positioned on a buried insulation layer positioned on a base substrate, at least one first PFET transistor in the first P-active region, and a plurality of second PFET transistors in the second P-active region, wherein the first P-active region has a first length (in the gate length direction of the device) and the second P-active region has a second length that is greater than the first length and wherein the number of second PFET transistors is greater than the number of first PFET transistors. In this example, the product also includes a tensile-stressed layer of material positioned on the at least one first PFET transistor and above the first P-active region and a compressive-stressed layer of material positioned on the plurality of second PFET transistors and above the second P-active region.

20 Claims, 15 Drawing Sheets

(56) References Cited

U.S. PATENT DOCUMENTS

2016/0056191 A1* 2/2016 Liu .................. H01L 27/14689
257/291

OTHER PUBLICATIONS

Horstmann et al., "Integration and Optimization of Embedded-SiGe, Compressive and Tensile Stressed Liner Films, and Stress Memorization in Advanced SOI CMOS Technologies," 2005 IEEE.
Pidin et al, "A Novel Strain Enhanced CMOS Architecture Using Selectively Deposited High Tensile and High Compressive Silicon Nitride Films," 2004 IEEE.

* cited by examiner

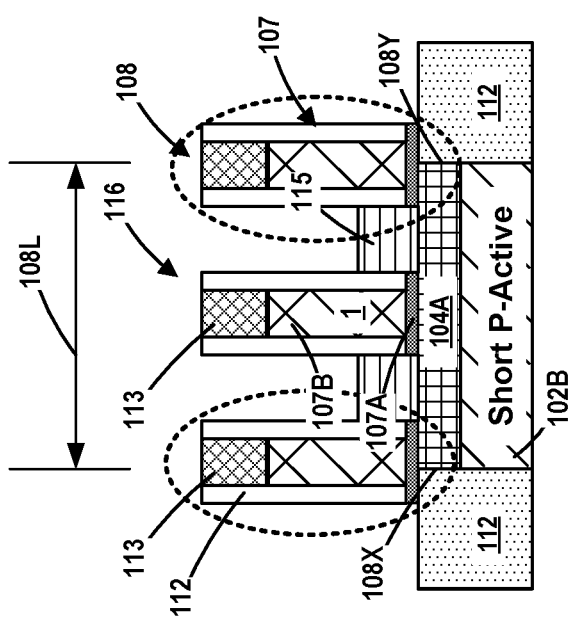
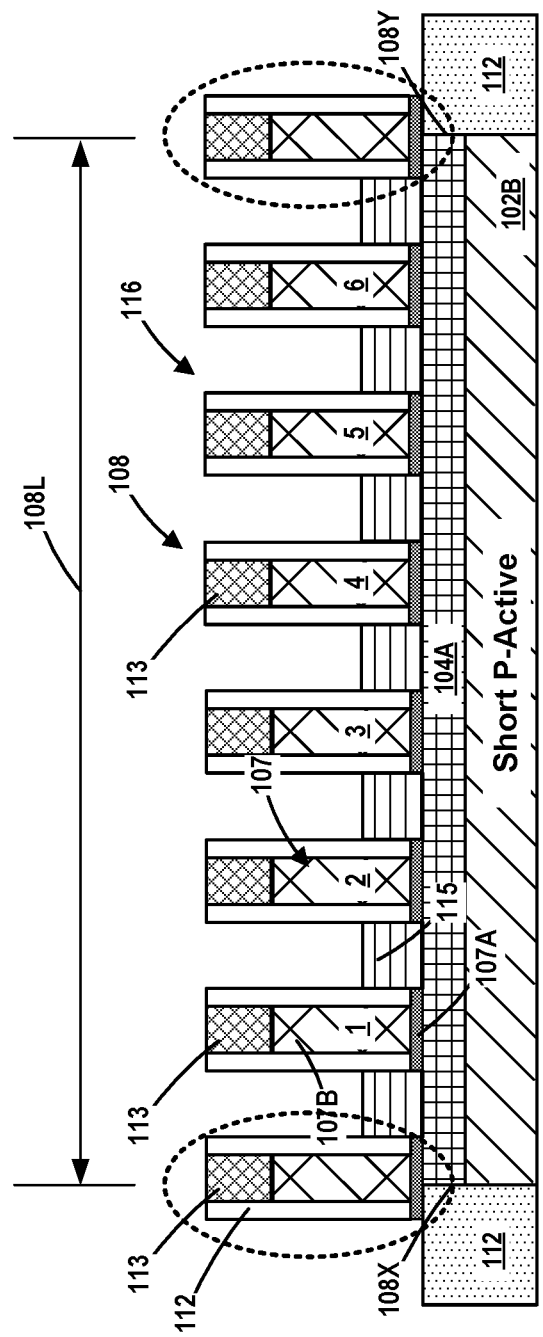

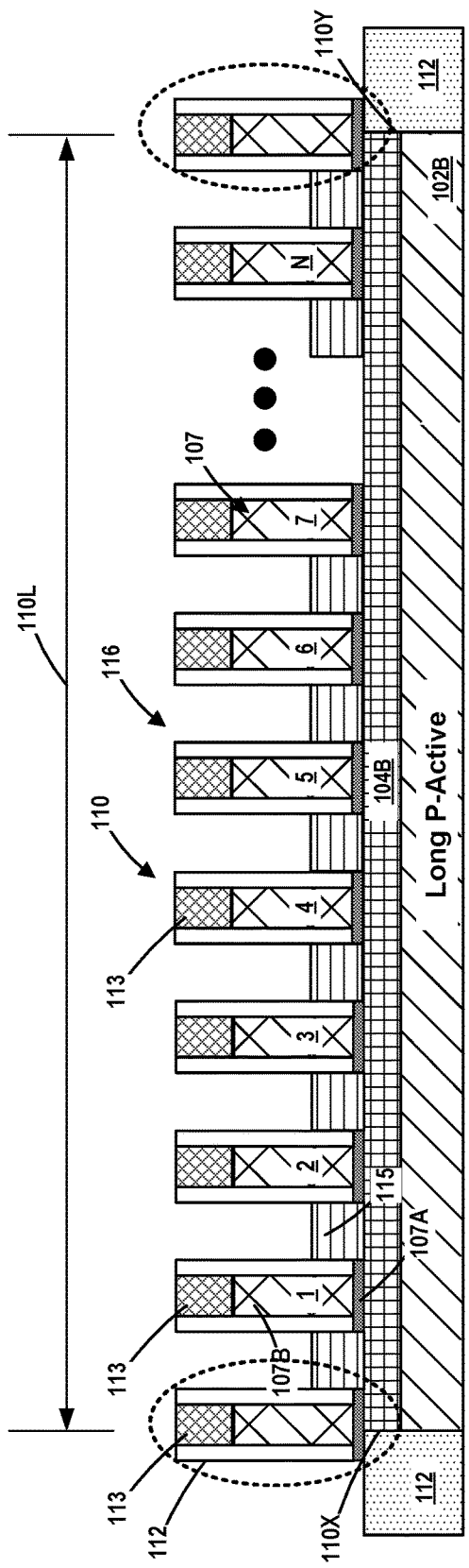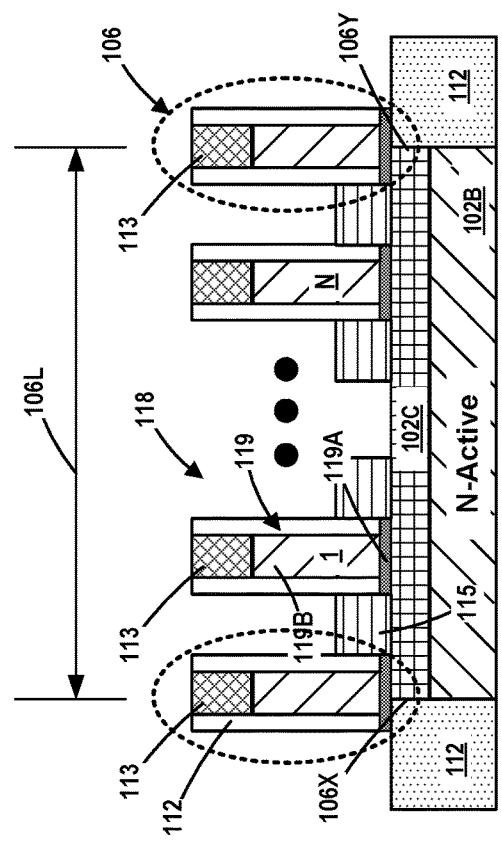

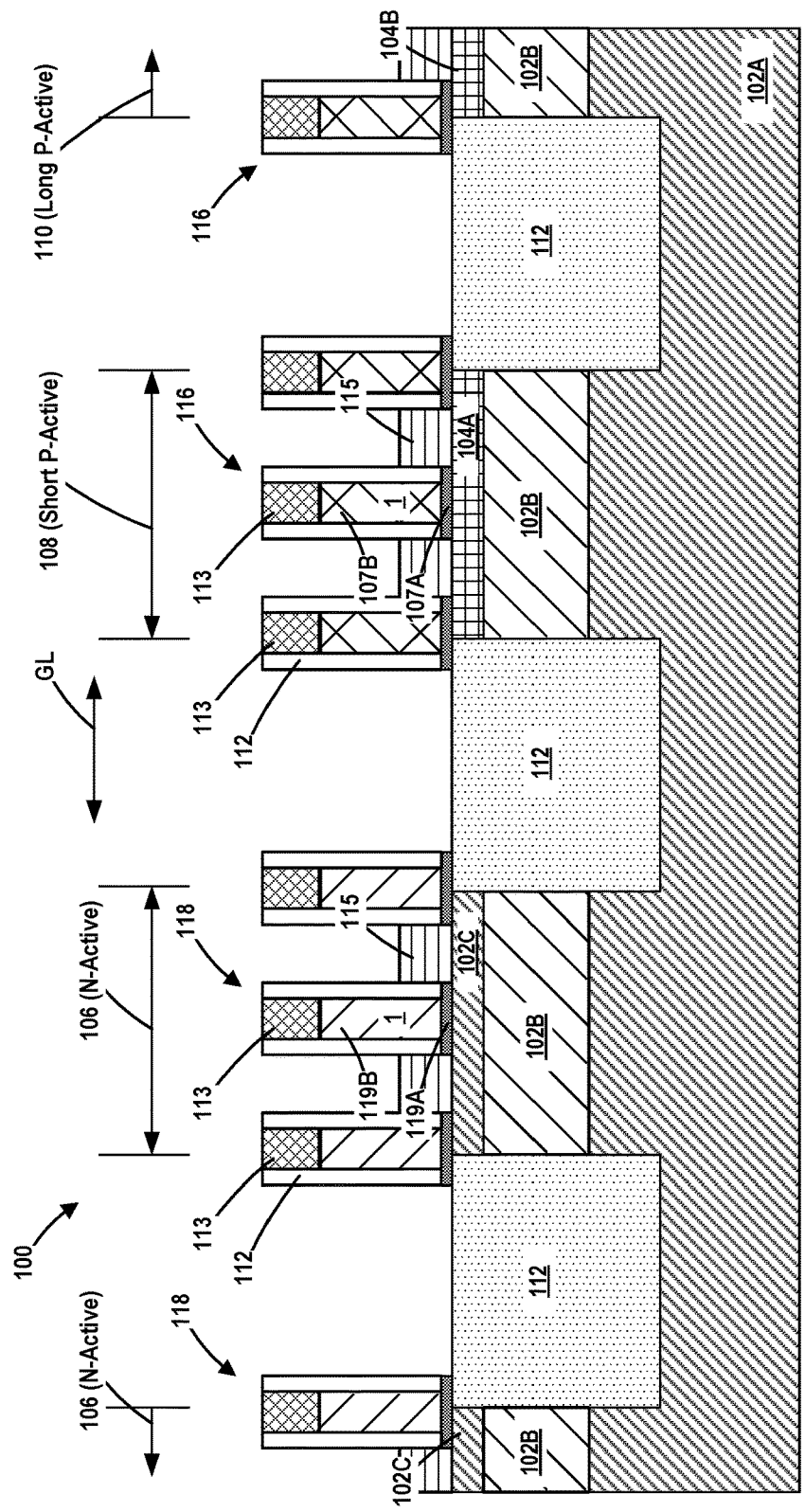

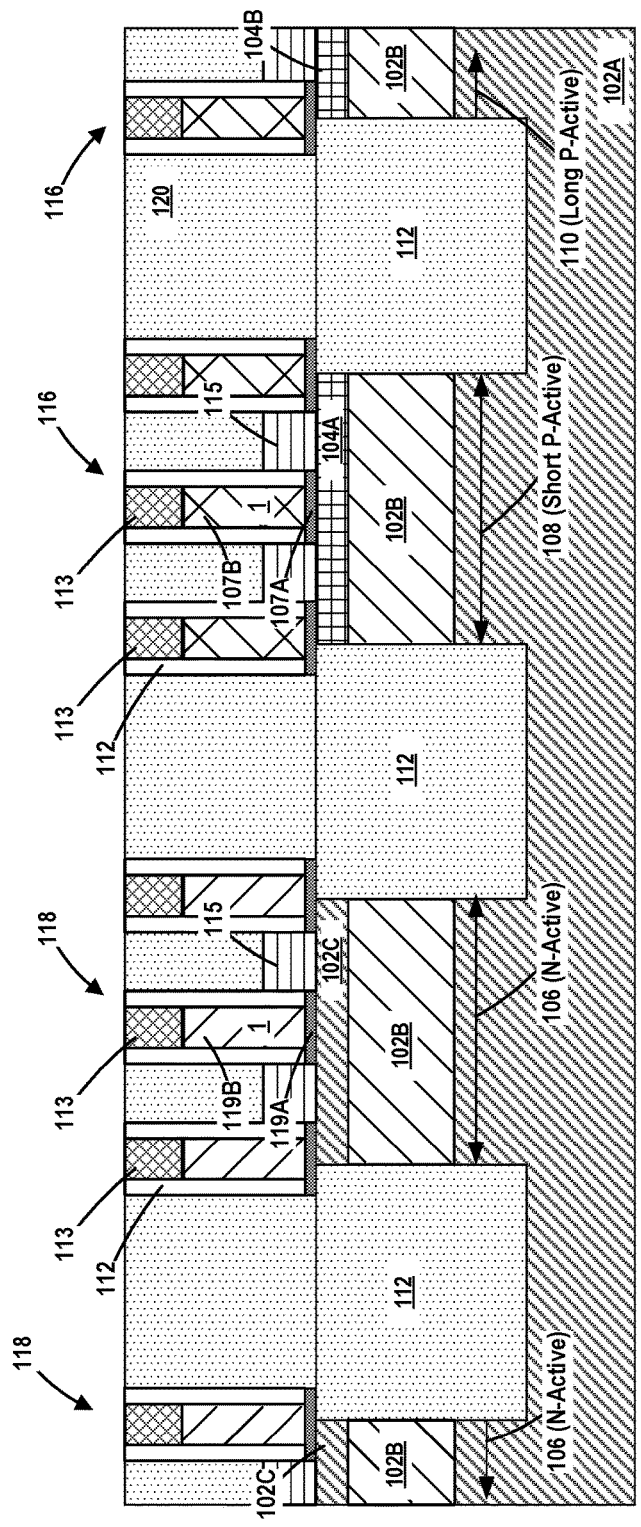

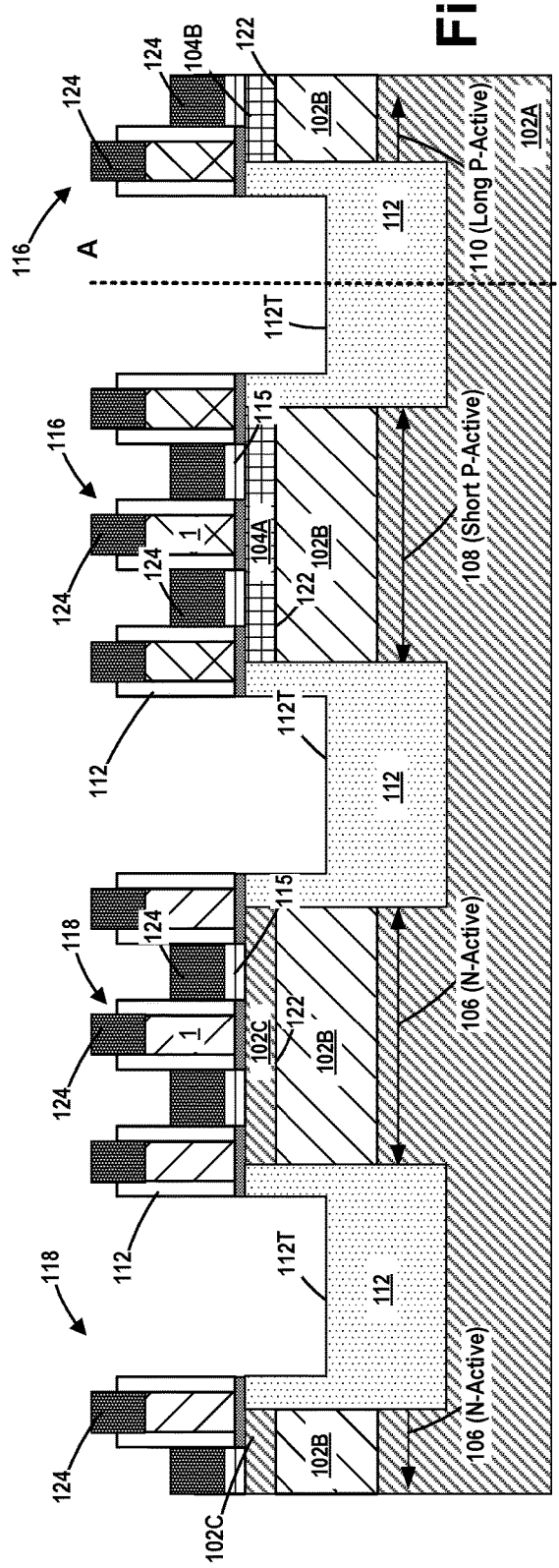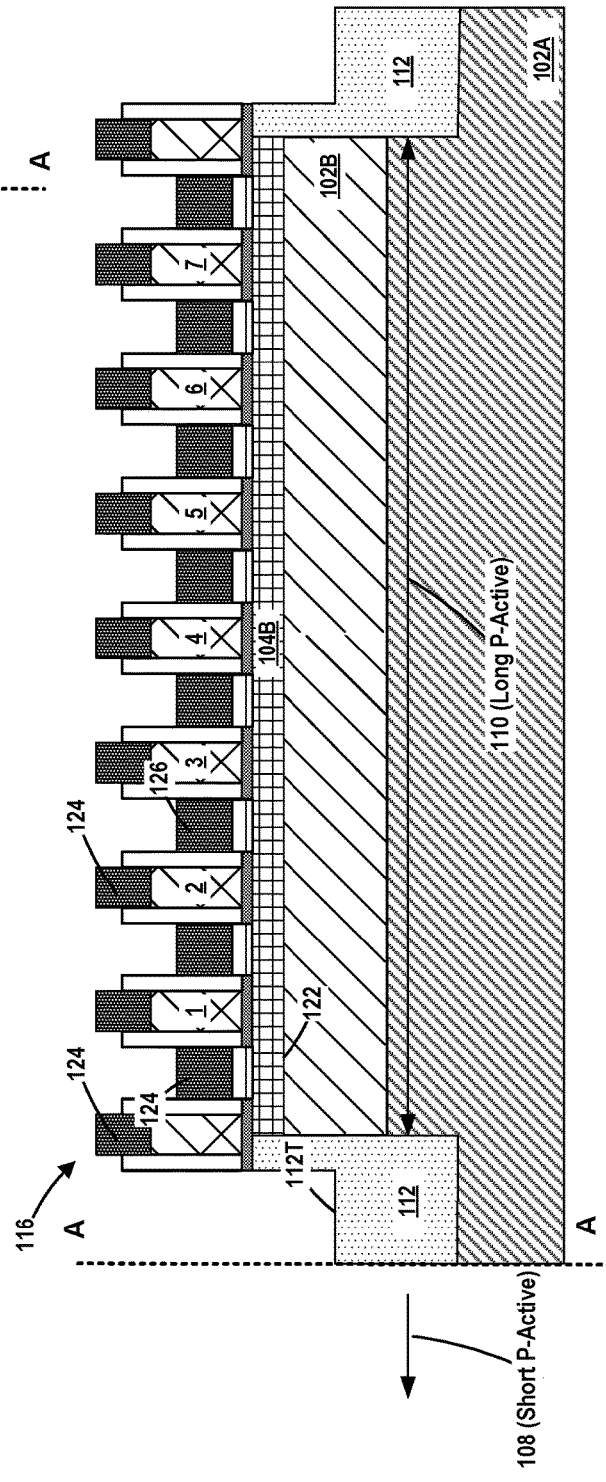

METHODS TO REDUCE OR PREVENT STRAIN RELAXATION ON PFET DEVICES AND CORRESPONDING NOVEL IC PRODUCTS

BACKGROUND

Field of the Disclosure

Generally, the present disclosure relates to various novel methods to reduce or prevent strain relaxation on PFET devices and corresponding novel integrated circuit (IC) products that include such technology.

Description of the Related Art

In modern integrated circuit products, such as microprocessors, storage devices, ASICs and the like, a very large number of circuit elements, especially transistors, are provided on a restricted chip area. The transistors come in a variety of shapes and forms, e.g., planar transistors, FinFET transistors, nanowire devices, etc. The transistors are typically either NFET or PFET type devices wherein the "N" and "P" designation is based upon the type of dopants used to create the source/drain regions of the devices.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NFET transistors and create a compressive stress in the channel region for PFET transistors).

Stress engineering techniques typically involve the formation of specifically made layers of material (e.g., silicon nitride) that are selectively formed above appropriate transistors, i.e., a layer of compressive-stressed material that is intended to impart a compressive stress in the channel region of a PFET transistor would only be formed above the PFET transistors. Such selective formation may be accomplished by masking the NFET transistors and then blanket-depositing the layer of compressive-stressed material on the exposed PFET transistors, or by initially blanket-depositing the layer of compressive-stressed material across the entire substrate and then performing an etching process to selectively remove the portions of the compressive-stressed material from above the NFET transistors. Conversely, for NFET transistors, a layer of tensile-stressed material that is intended to impart a tensile stress in the channel region of a NFET transistor is formed above the NFET transistors. The techniques employed in forming such layers of stressed material with the desired magnitude of compressive or tensile stress are well known to those skilled in the art. Unfortunately, the desired imparted stress on the channel regions of the transistors may tend to significantly decrease at some point after formation of the initial stressed layer of material. This problem may be particularly acute for PFET transistors. The loss or reduction of the desired amount of stress in the channel region of the transistors may tend to reduce device performance capabilities.

The present disclosure is directed to various novel methods to reduce or prevent strain relaxation on PFET devices and corresponding novel integrated circuit (IC) products that may avoid, or at least reduce, the effects of one or more of the problems identified above.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various novel methods to reduce or prevent strain relaxation on PFET devices and corresponding novel integrated circuit (IC) products that include such technology. One illustrative integrated circuit product disclosed herein includes first and second spaced-apart P-active regions positioned above a buried insulation layer positioned on a base substrate, at least one first PFET transistor in the first P-active region, and a plurality of second PFET transistors in the second P-active region, wherein the first P-active region has a first length (in the gate length direction of the device) and the second P-active region has a second length that is greater than the first length, and wherein the number of second PFET transistors is greater than the number of first PFET transistors. In this example, the product also includes a tensile-stressed layer of material positioned on the at least one first PFET transistor and above the first P-active region and a compressive-stressed layer of material positioned on the plurality of second PFET transistors and above the second P-active region.

One illustrative method disclosed herein includes forming first and second spaced-apart P-active regions, forming at least one first PFET transistor in the first P-active region and forming a plurality of second PFET transistors in the second P-active region, wherein the first P-active region has a first length and the second P-active region has a second length that is greater than the first length, and wherein the number of second PFET transistors is greater than the number of first PFET transistors. In this example, the method also includes forming a tensile-stressed layer of material on the at least one first PFET transistor and above the first P-active region and forming a compressive-stressed layer of material on the plurality of second PFET transistors and above the second P-active region.

BRIEF DESCRIPTION OF THE DRAWINGS

The disclosure may be understood by reference to the following description taken in conjunction with the accompanying drawings, in which like reference numerals identify like elements, and in which:

FIGS. 1-21 depict various illustrative novel methods disclosed herein to reduce or prevent strain relaxation on PFET devices and corresponding novel integrated circuit (IC) products that include such technology.

Figure 1:
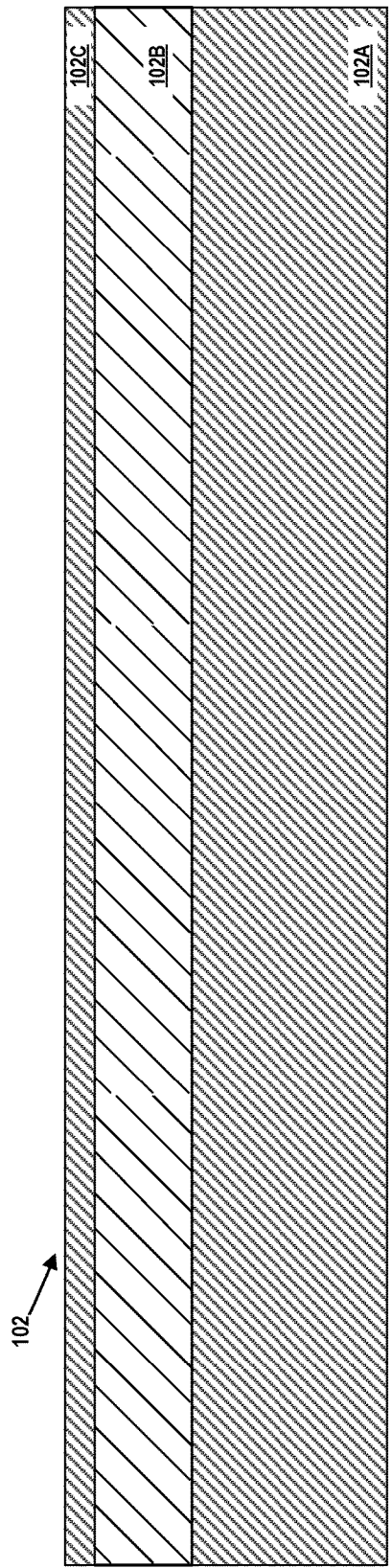

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the methods disclosed herein may be employed in manufacturing a variety of different devices, including, but not limited to, logic devices, memory devices, etc., and the devices may be may be either NFET or PFET devices. As will also be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-21 depict various illustrative novel methods disclosed herein to reduce or prevent strain relaxation on PFET devices and corresponding novel integrated circuit products 100. FIG. 1 depicts an illustrative SOI (semiconductor-on-insulator) structure 102. In general, the SOI structure 102 is comprised of a base semiconducting substrate 102A, a buried insulation layer 102B (sometime referred to as a "BOX" layer when the insulation layer comprises silicon dioxide) and an active layer 102C comprised of a semiconducting material. Traditionally, and in one illustrative embodiment, the base semiconducting substrate 102A may comprise silicon, the buried insulation layer 102B may comprise silicon dioxide and the active layer 102C may comprise silicon. Of course, the base semiconducting substrate 102A and the active layer 102C may be made of any of a variety of different semiconductor materials, and the materials for the base semiconducting substrate 102A and the active layer 102C need not be made of the same material in all applications, but such a situation may occur in some applications. Similarly, the buried insulation layer 102B may be comprised of a variety of different insulating materials. The thickness of the layers of the SOI substrate 102 may vary depending upon the particular application. The manner in which such SOI substrates 102 are manufactured are well known to those skilled in the art.

Figure 2:
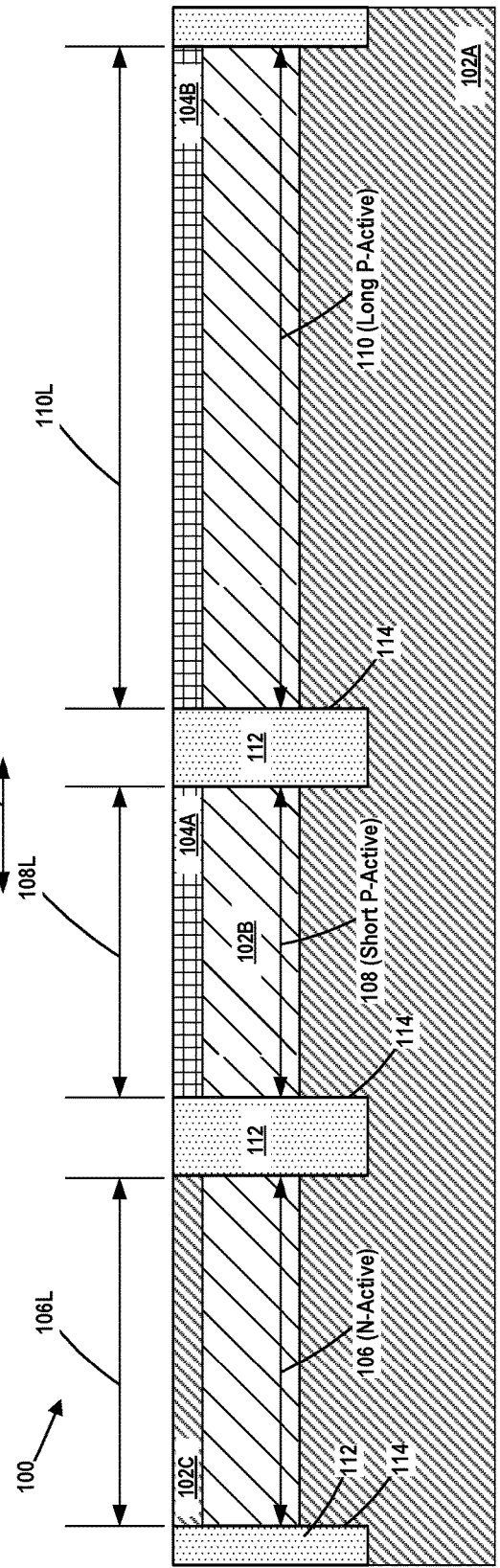

FIG. 2 depicts the product 100 after several process operations were performed on the SOI substrate 102 to form an N-active region 106 where NFET transistors will be formed, a short P-active region 108 where PFET transistors will be formed, and a long P-active region 110 where PFET transistors will be formed. In one illustrative process flow, the N-active region 106 comprises a portion of the original active layer 102C, e.g., silicon, a material that is appropriate for the formation of channel regions for NFET transistors, while the short P-active region 108 and the long P-active region 110 comprises semiconductor active regions 104A, 104B (collectively referenced using the numeral 104), wherein the material 104 is appropriate for the formation of channel regions for PFET transistors, e.g., silicon germanium. Of course, the materials for the regions 104A, 104B need not be the same in all applications, but that may be the case in some applications. For example, while both of the regions 104 may comprise silicon-germanium, the germanium concentration in the regions 104A, 104B may be different. The thickness of the semiconductor materials 102C, 104A and 104B may vary depending upon the application. For example, the thicknesses of the materials 102C, 104A and 104B may be tailor made for the formation of fully-depleted transistor devices. The thicknesses of the materials 102C, 104A and 104B need not all be equal, but that may be the case in some applications.

Also depicted in FIG. 2 are a plurality of isolation structures 112 that are positioned between, and electrically isolate, the active regions 106, 108 and 110 from one another. In one illustrative embodiment, when viewed from above, the active regions 106, 108 and 110 may have a generally rectangular configuration, although the physical size of the rectangular-shaped regions 106, 108 and 110 may be different from one another. In the depicted example, the isolation structures 112 were formed by forming trenches 114 that extend into the base semiconducting substrate 102A, and thereafter overfilling the trenches with an insulating material, e.g., silicon dioxide. The insulating material used for the isolation structures 112 may be the same as or different from the material of the buried insulation layer 102B. At that point, a CMP and/or etch-back process may be performed to remove excess amounts of the insulating material of the isolation structures 112 and thereby expose the upper surfaces of the active regions 106, 108 and 110. There are many ways that are known to those skilled in the art for forming the spaced-apart active regions 106, 108 and 110 depicted in FIG. 2.

With continuing reference to FIG. 2, the cross-sectional view of the substrate is taken in what will become the gate-length (GL) direction of the transistor devices that will be formed above the active regions 106, 108, 110. As depicted, the active regions 106, 108, 110 have lengths 106L, 108L and 110L in the gate length direction. The length 106L may be of any desired length so as to accommodate the number of NFET transistors that will be formed on active region 106. In general, the length 108L of the short P-active region 108 is less than the length 110L of the long P-active region 110. When it is stated herein and in the attached claims that the length 108L is less than the length 110L, it means that there is a material difference in the lengths 108L, 110L such that a greater number of PFET transistors may be formed on the long P-active region 110 than can be formed on the short P-active region 108, i.e., a minor difference between the lengths 108L and 110L due to manufacturing tolerances would not constitute a material difference in the lengths 108L and 110L. The absolute value of the lengths 108L and 110L may vary upon the particular application and the size of the transistor devices. In one illustrative embodiment, based upon current day technology, the length 108L of the short P-active region 108 may range up to about 200 nm, while the length 110L of the long P-active region 110 may be greater than 210 nm.

FIG. 3 depicts an embodiment of the short P-active region 108 wherein a single active PEFT transistor 116, identified with the numeral 1, was formed above the short P-active region 108. The two gate structures encircled in dashed lines and positioned above the opposing lateral edges 108X, 108Y of the short P-active region 108 are "dummy gates" as it relates to the operation of the single active transistor shown in FIG. 3. Those skilled in the art will appreciate the two outermost gate structures shown in FIG. 3 are sometimes referred to as "tucked" gate structures. Also depicted in FIG. 3 are portions of the two isolation structures 112 that are positioned laterally adjacent the short P-active region 108 as well as a portion of the buried insulation layer 102B that is positioned beneath the short P-active region 108.

FIG. 4 depicts an embodiment of the short P-active region 108 wherein a plurality of active PEFT transistors 116, identified with the numerals 1-6, were formed above the short P-active region 108. As before, the two gate structures encircled in dashed lines and positioned above the opposing lateral edges 108X, 108Y of the short P-active region 108 are "dummy gates" as it relates to the operation of the six active transistors shown in FIG. 4. That is, such tucked transistors are not considered to be active transistor devices formed above the short P-active region 108. As before, also depicted in FIG. 4 are portions of the two isolation structures 112 that are positioned laterally adjacent the short P-active region 108 as well as a portion of the buried insulation layer 102B that is positioned beneath the short P-active region 108. In one illustrative embodiment, based upon current day technologies, the short P-active region 108 may comprise only a single active PFET transistor 116 or it may comprise at most six active PFET transistors 116.

FIG. 5 depicts an embodiment of the long P-active region 110 wherein a minimum of seven active PEFT transistors 116, identified with the numerals 1-n, were formed above the long P-active region 110. As before, the two gate structures encircled in dashed lines and positioned above the opposing lateral edges 110X, 110Y of the long P-active region 110 are "dummy gates" as it relates to the operation of the "n" active transistor shown in FIG. 5. That is, such tucked transistors are not considered to be active transistor devices formed above the long P-active region 110. As before, also depicted in FIG. 5 are portions of the two isolation structures 112 that are positioned laterally adjacent the long P-active region 110 as well as a portion of the buried insulation layer 102B that is positioned beneath the long P-active region 110. In one illustrative embodiment, based upon current day technologies, the long P-active region 110 comprises at least seven active PFET transistors 116.

FIG. 6 depicts an embodiment of the N-active region 106 wherein any desired number of active NFET transistors 118, identified with the numerals 1-n, were formed above the N-active region 106. As before, the two gate structures encircled in dashed lines and positioned above the opposing lateral edges 106X, 106Y of the N-active region 106 are "dummy gates" as it relates to the operation of the "n" active transistor shown in FIG. 6. That is, such tucked transistors are not considered to be active transistor devices formed above the N-active region 106. As before, also depicted in FIG. 6 are portions of the two isolation structures 112 that are positioned laterally adjacent the N-active region 106 as well as a portion of the buried insulation layer 102B that is positioned beneath the N-active region 106.

The PFET transistors 116 and NFET transistors 118 referenced herein and in the attached claims are intended to be representative in nature of any type of PFET transistor or NFET transistor that may be formed on an integrated circuit product. Thus, the particular form, structure or composition of the PFET transistors 116 and NFET transistors 118 and the manner in which they are made should not be considered to be a limitation with respect to any of the inventions disclosed herein.

In the depicted example, the PFET transistors 116 and NFET transistors 118 are depicted as planar transistor devices that are manufactured using gate-first manufacturing techniques. The PFET transistors 116 generally comprise a gate structure 107 (that includes an illustrative gate insulation layer 107A and an illustrative gate electrode structure 107B). a sidewall spacer 112 (e.g., silicon nitride), a gate cap 113 (e.g., silicon nitride) and regions of epi semiconductor material 115 that are formed in the source/drain regions of the PFET transistors 116.

The NFET transistors 118 generally comprise a gate structure 119 (that includes an illustrative gate insulation layer 119A and an illustrative gate electrode structure 119B), a sidewall spacer 112 (e.g., silicon nitride), a gate cap 113 (e.g., silicon nitride) and regions of epi semiconductor material 115 that are formed in the source/drain regions of transistors. In the depicted example, the PFET transistors 116 and NFET transistors 118 are simplistically depicted as comprising the same sidewall spacer 112, gate cap 113 and epi semiconductor material 115, although that may not be the case in real-world transistor devices.

The gate structures 107 for the PFET transistors 116 and the gate structures 119 for the NFET transistors 118 may comprise different materials, but in some embodiments, they may be comprised of the same materials. In the depicted example, the gate insulation layers 107A, 119A may be comprised of a variety of different materials, such as, for example, silicon dioxide, a so-called high-k (k value greater than 10) insulation material, etc. Similarly, the gate electrode structures 107B, 119B may be made of polysilicon or one or more layers of metal-containing material. In the depicted example, the gate insulation layers 107A, 119A are made of silicon dioxide, the gate electrode structures 107B, 119B are made of polysilicon, the sidewall spacers 112 are made of silicon nitride, and the gate caps 113 are made of silicon nitride. In the example depicted herein, the epi semiconductor material 115 for the PFET transistors 116 may be silicon-germanium, while the epi semiconductor material 115 for the NFET transistors 118 may be silicon-carbon. Additionally, the PFET transistors 116 formed on the short P-active region 108 need not necessarily have the same identical construction as that of the PFET transistors 116 formed on the long P-active region 110. For example, the thickness of the gate insulation layer 107A and/or the gate length of the PFET transistors 116 in the short P-active region 108 may be different from the gate insulation layer 107A and/or the gate length of the PFET transistors 116 in the long P-active region 110. Additionally, the gates structures 107, 119 may be manufactured using either so-called "gate-first" or "gate-last" manufacturing techniques.

The PFET transistors 116 and NFET transistors 118 may be formed using any desired process flow, the exact nature of which may depend upon the type of devices being constructed, e.g., planar devices, FinFET devices, etc., the materials of construction of the devices and the desired manufacturing technique use to make the devices. One illustrative process flow will be depicted herein. However, the presently disclosed inventions should not be considered to be limited to this illustrative process flow. FIG. 7 is a cross-sectional view of a portion of the product 100, wherein a single active transistor is formed in each of the N-active region 106 and the short P-active region 108. A tucked transistor at the edge of the long P-active region 110 is shown on the right side of FIG. 7. FIG. 7 depicts the product 100 after the isolation structures 112 were formed and after the PFET transistors 116 and NFET transistors 118 were formed above the appropriate active regions.

FIG. 8 depicts the product 100 after a layer of insulating material 120 (e.g., silicon dioxide) was blanket-deposited across the product 100 so as to over-fill the open spaces on the product 100. Thereafter, a CMP and/or etch-back process was performed to planarize the upper surface of the layer of insulating material 120 with the upper surface of the gate caps 113.

In the illustrative process flow depicted herein, a metal silicide material (not shown in FIG. 9) will be formed on the gate electrode structures 107B, 119B of the PFET transistors 116 and NFET transistors 118, respectively, as well as on the regions of epi semiconductor material 115 for both the PFET transistors 116 and NFET transistors 118. In the depicted process flow, the same type of metal silicide material will be formed on both the PFET transistors 116 and NFET transistors 118, but that may not be the case in all applications. Accordingly, FIG. 9 depicts the product 100 after one or more etching and CMP process operations were performed to remove the gate caps 113 and thereby expose the upper surface of the gate electrode structures 107B, 119B. In the depicted example, at least one CMP process operation was performed such that the upper surfaces of the gate electrode structures 107B, 119B are substantially planar with the upper surface of the layer of insulating material 120.

Figure 10:
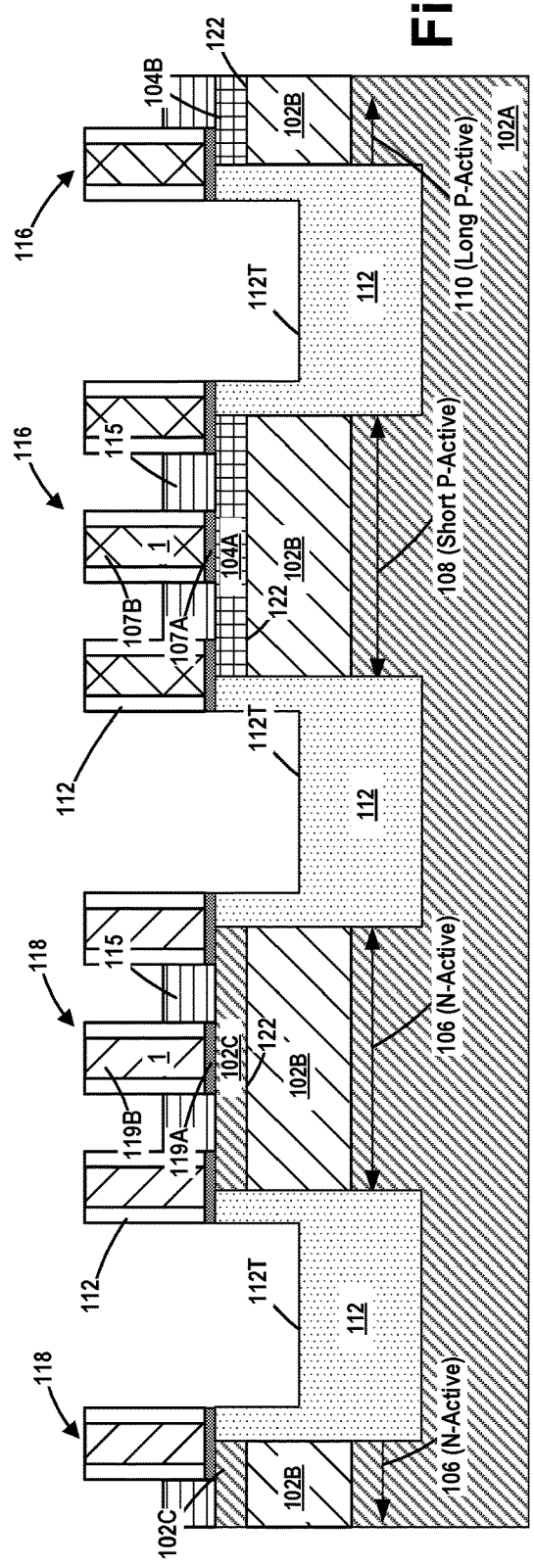

FIG. 10 depicts the product 100 after an etching process was performed to remove the remaining portion of the layer of insulating material 120. The insulating material 120 was removed such that the regions of epi semiconductor material 115 are exposed so as to permit formation of a metal silicide material on the regions of epi semiconductor material 115. In an effort to ensure that the regions of epi semiconductor material 115 are free of the insulating material 120, an over-etching process is performed which results in the formation of trenches 112T in the isolation structures 112. The depth of the trenches 112T may vary depending upon the particular application. In one illustrative embodiment, the bottom of the trenches 112T is positioned at a level that is below the level of the bottom surface 122 of the active regions 106, 108, 110 (whichever is lowest). In one illustrative embodiment, the bottom of the trenches 112T may be about 10-40 nm below the bottom surface 122 of the lowermost of the active regions 106, 108, 110.

Figure 11:
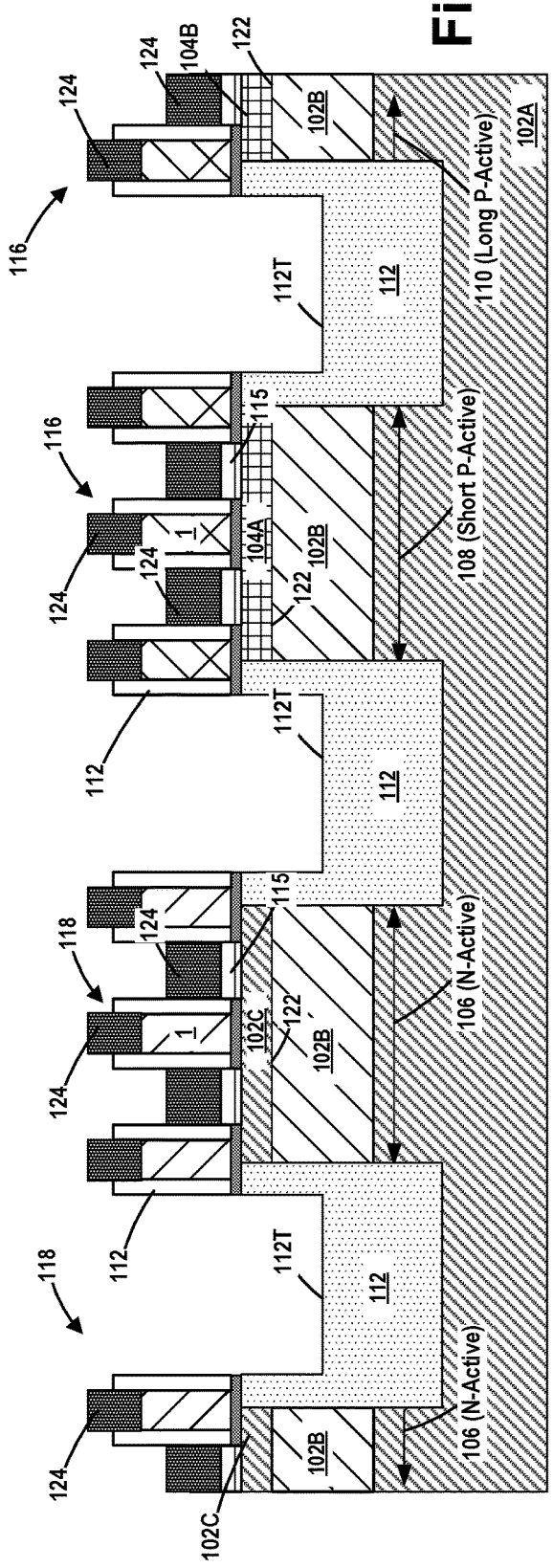

FIG. 11 depicts the product 100 after simplistically depicted regions of metal silicide material 124 were formed on the gate electrode structures 107B, 119B and on the regions of epi semiconductor material 115. In a field effect transistor, metal silicide regions are typically formed on a component of a transistor (e.g., a source/drain region, a gate structure, etc.) to reduce the resistance when a conductive contact is formed to establish electrical connection to the component. The metal silicide regions 124 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. The details of such silicidation processes are well known to those skilled in the art.

The subsequent drawings will depict one illustrative process flow for forming stressed layers of material on the transistor devices for purposes of introducing desired stress profiles in the channel regions of the PFET transistors 116 and NFET transistors 118. The combination of FIGS. 12 and 13 depict one illustrative embodiment of the product 100, wherein one illustrative NFET transistor 118 is formed above the N-active region 106, one illustrative PFET transistor 116 is formed above the short P-active region 108 and seven illustrative PFET transistors 116 (number 1-7) are formed above the long P-active region 110. A common reference line "A-A" is depicted in both FIGS. 12 and 13. FIGS. 12-13 depict the product 100 at a point in fabrication after the metal silicide regions 124 were formed on the product as described above.

Figure 14:
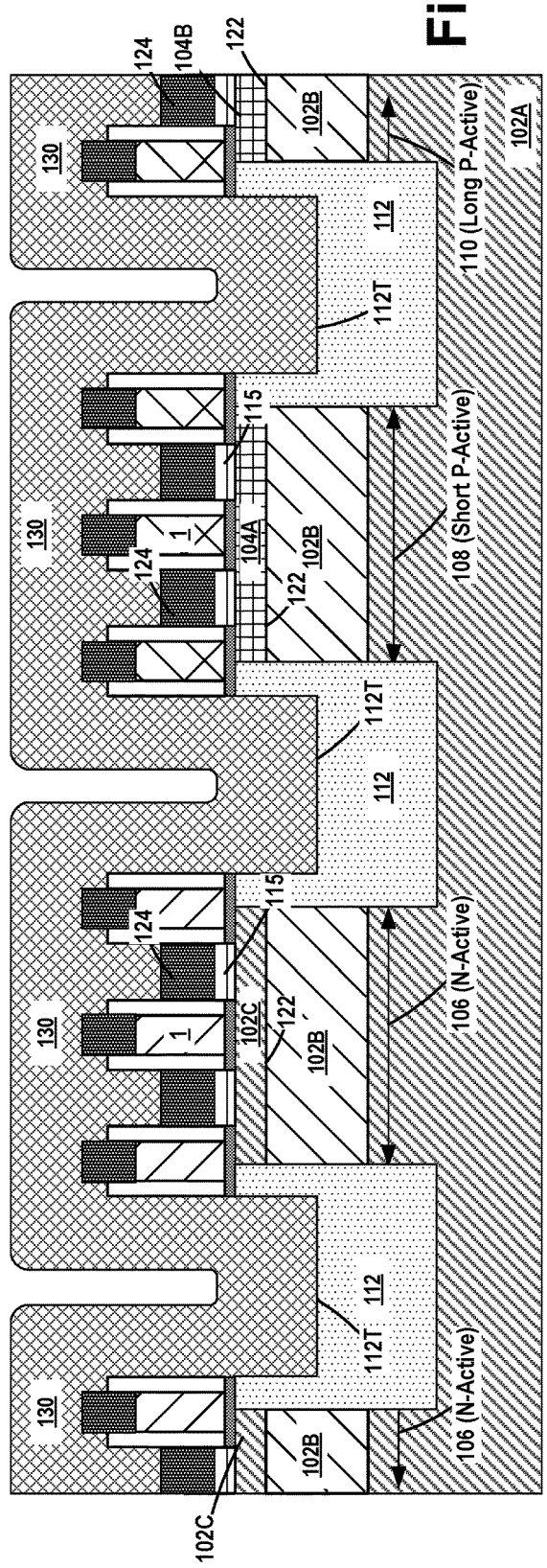
Figure 15:
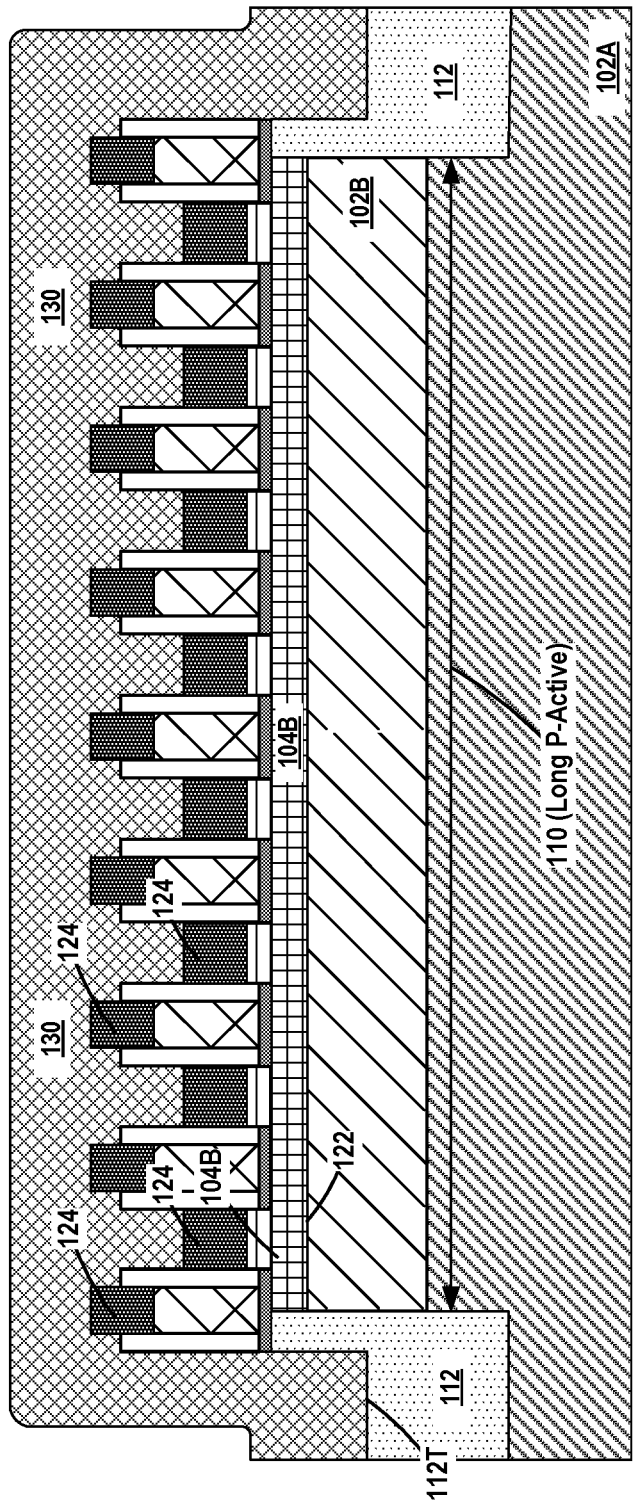

FIGS. 14-15 depict the product after a tensile-stressed layer of material 130 was deposited across the product 100 and the active regions 106, 108 and 110. The tensile-stressed layer of material 130 may be formed from a variety of materials and it may be formed by performing a variety of known techniques. In one illustrative example, the tensile-stressed layer of material 130 may be comprised of a material such as silicon nitride, it may have a thickness of about 10-40 nm, and it may be formed by performing a CVD process wherein the parameters of the CVD process are adjusted and controlled such that the tensile-stressed layer of material 130 exhibits the desired tensile stress, e.g., 0.5-2 GPa. The manner in which this is accomplished is well known to those skilled in the art. Note that a relatively thin etch stop layer (not shown), e.g., silicon dioxide, may be formed on the product prior to the formation of the tensile-stressed layer of material 130.

Figure 16:
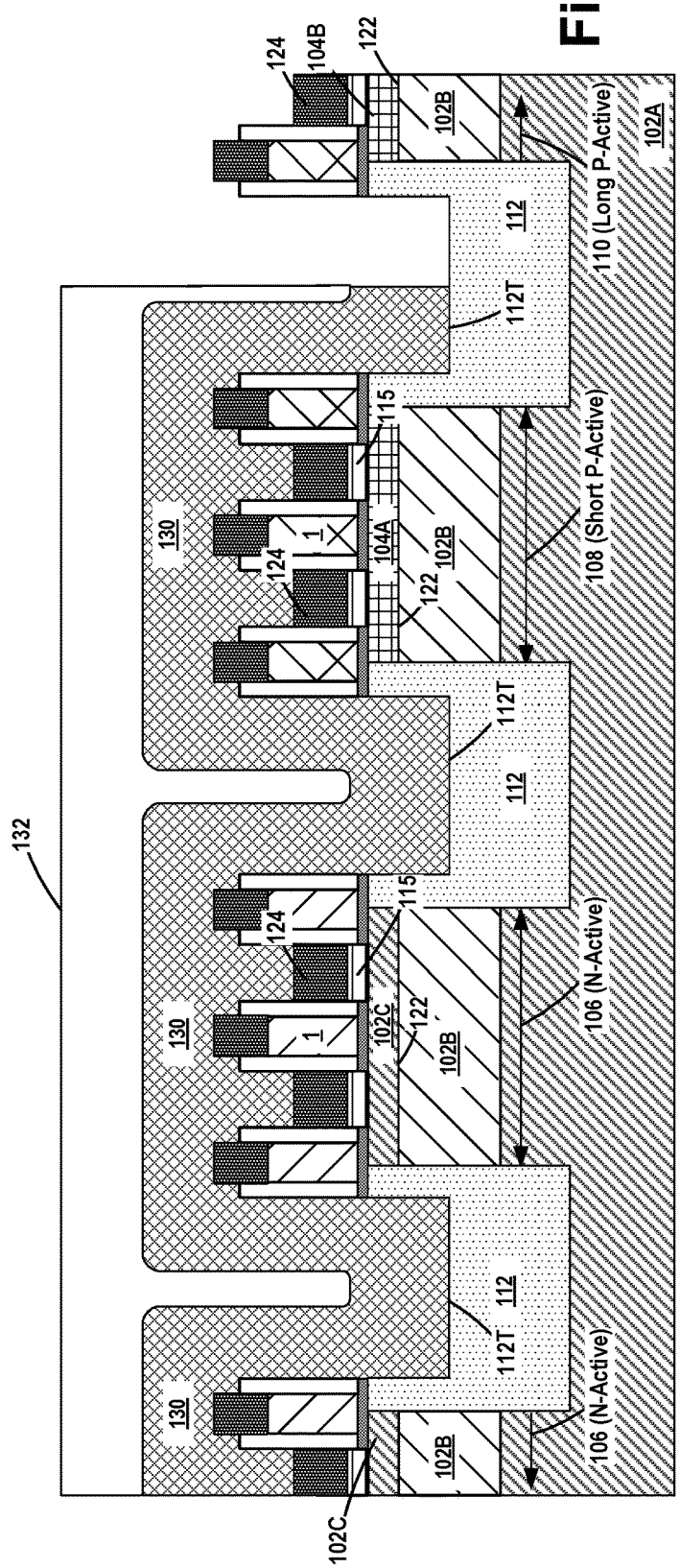
Figure 17:
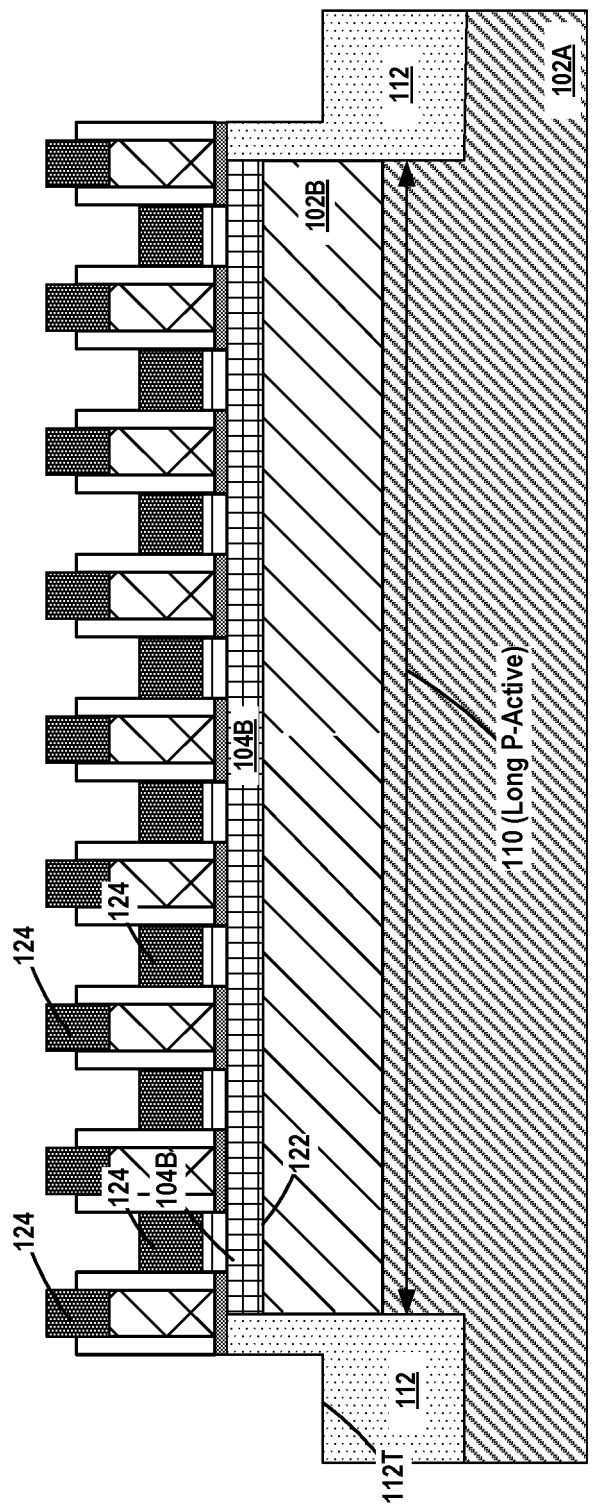

FIGS. 16-17 depict the product after several process operations were performed. First, a patterned etch mask 132, e.g., a patterned OPL layer or photoresist, was formed on the product 100 by performing traditional manufacturing techniques. The patterned etch mask 132 covers the N-active regions 106 and the short P-active regions 108 across the product 100, but has openings above the various long P-active regions 110 on the product 100. Next, an etching process was performed to remove the portions of the tensile-stressed layer of material 130 positioned above the long P-active regions 110 while leaving the tensile-stressed layer of material 130 in place above the N-active regions 106 and the short P-active regions 108 across the product 100. Specifically note that, unlike various prior art process flows, the tensile-stressed layer of material 130 will remain in position above the PFET transistors 116 formed on the short P-active region 108 for reasons explained more fully below.

Figure 18:
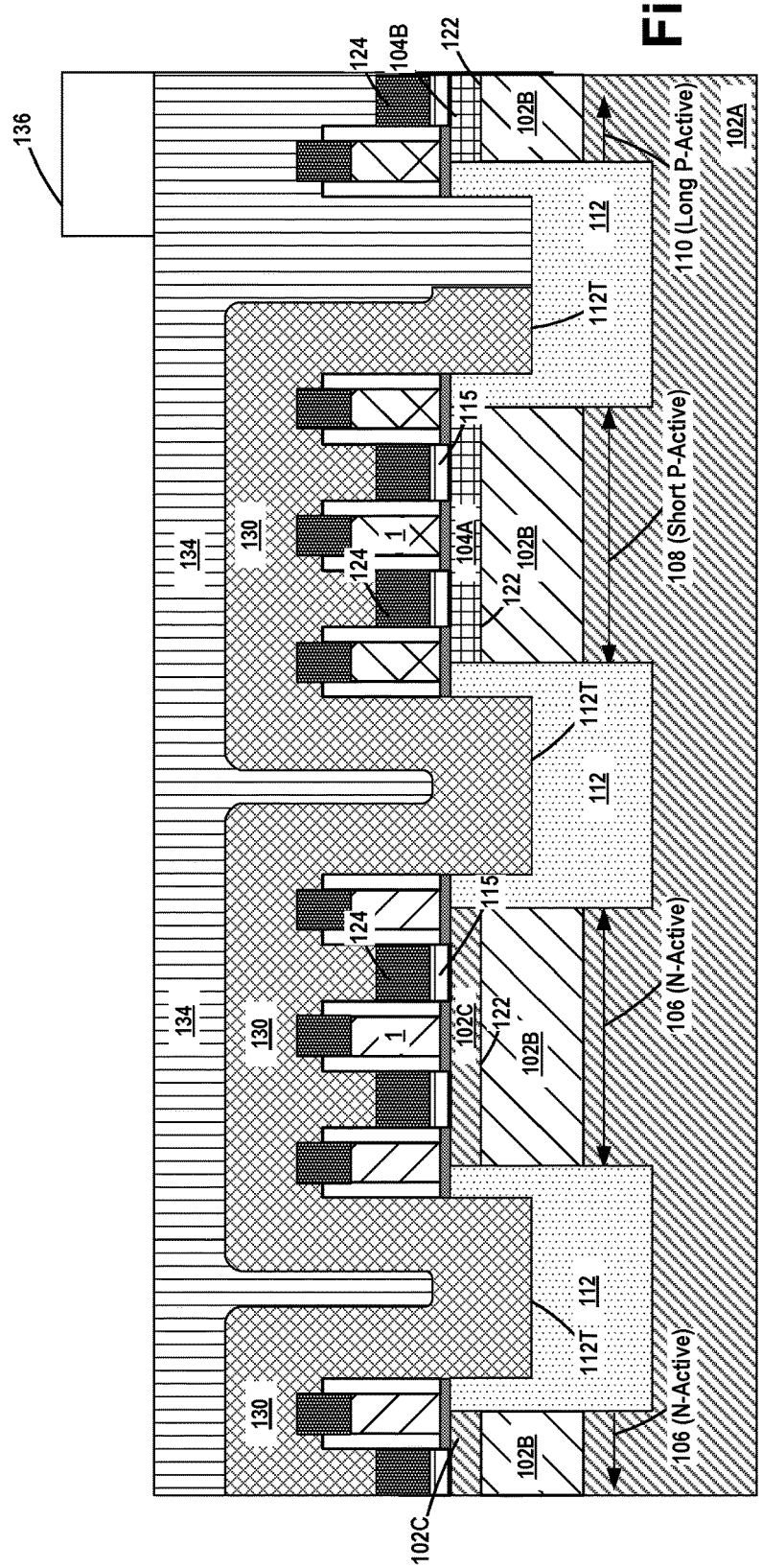
Figure 19:
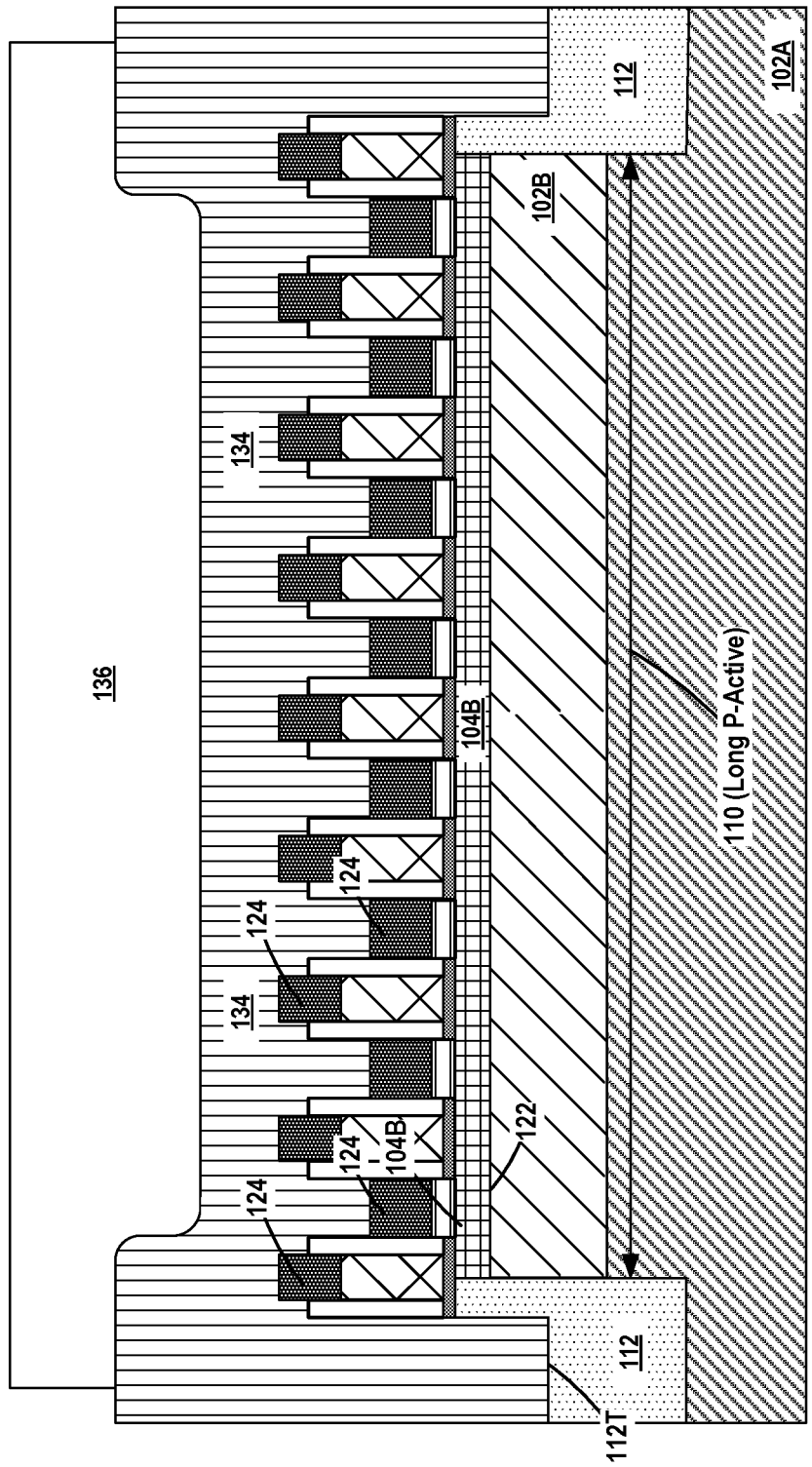

FIGS. 18-19 depict the product after several process operations were performed. First, the patterned etch mask 132 was removed. Thereafter, a compressive-stressed layer of material 134 was deposited across the product 100 and the active regions 106, 108 and 110. The compressive-stressed layer of material 134 may be formed from a variety of materials and it may be formed by performing a variety of known techniques. In one illustrative example, the compressive-stressed layer of material 134 may be comprised of a material such as silicon nitride, it may have a thickness of about 10-40 nm, and it may be formed by performing a CVD process wherein the parameters of the CVD process are adjusted and controlled such that the compressive-stressed layer of material 134 exhibits the desired compressive stress, e.g., 0.5-4 GPa. The manner in which this is accomplished is well known to those skilled in the art. As before, a relatively thin etch stop layer (not shown), e.g., silicon dioxide, may be formed on the product prior to the formation of the compressive-stressed layer of material 134. Then, another patterned etch mask 136, e.g., a patterned OPL layer or photoresist, was formed on the product 100 by performing traditional manufacturing techniques. The patterned etch mask 136 covers the various long P-active regions 110 on the product 100 across the product 100, but it also has a plurality of openings located above the various N-active regions 106 and the short P-active regions 108 that are formed across the product 100.

Figure 20:
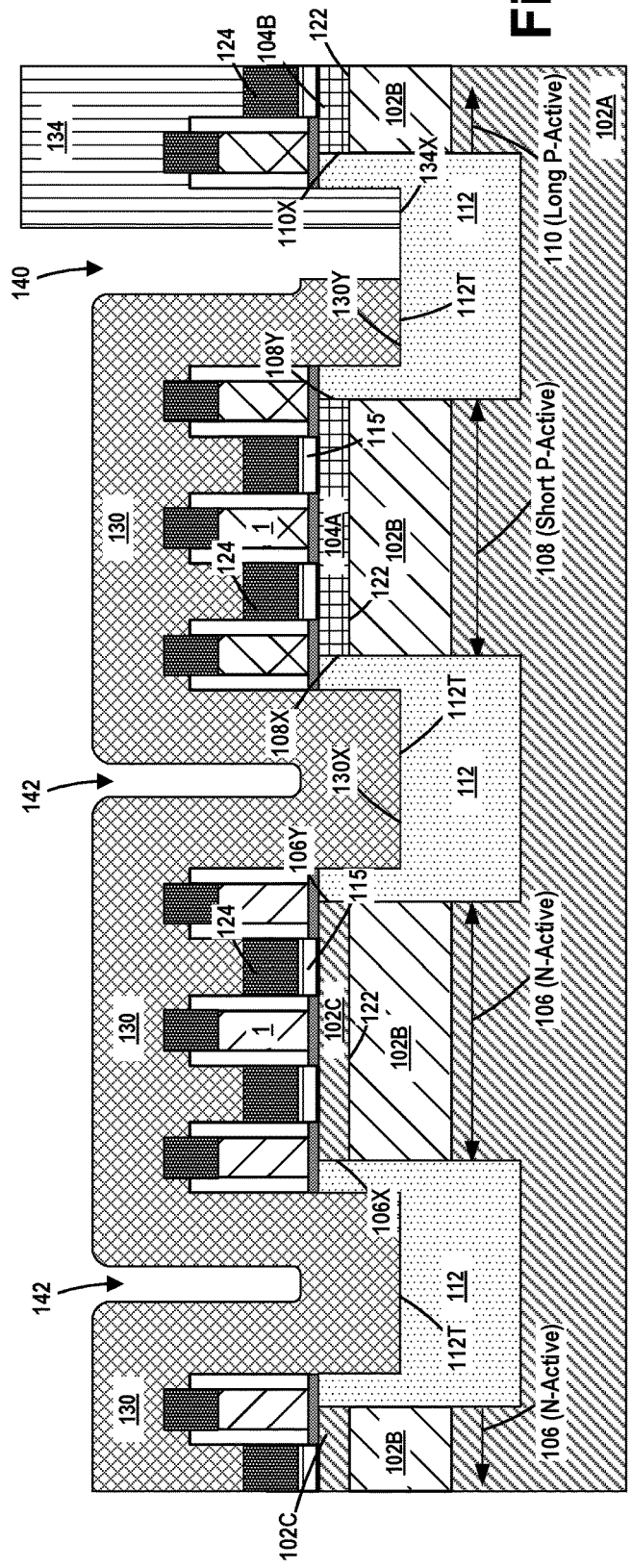
Figure 21:
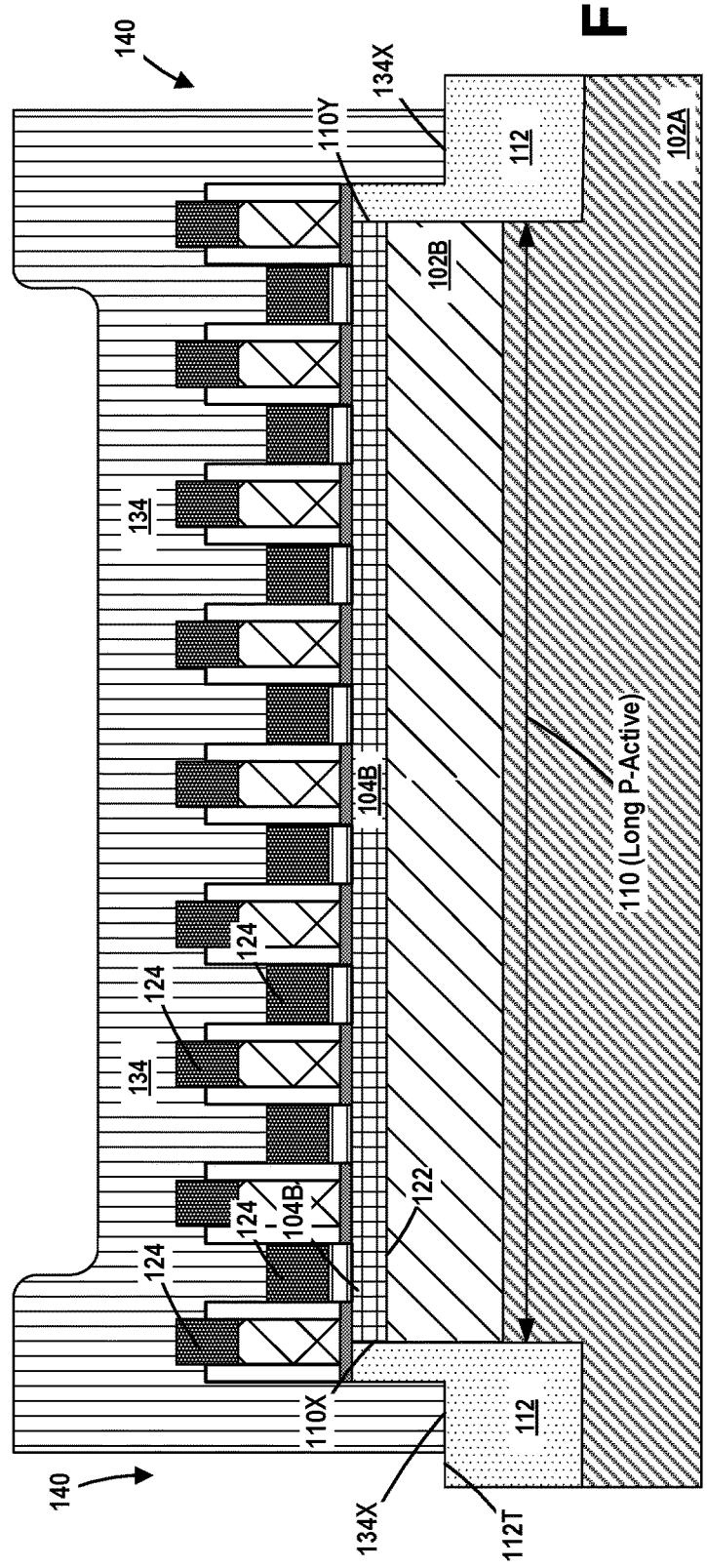

FIGS. 20-21 depict the product 100 after several process operations were performed. First, an etching process was performed to remove the portions of the compressive-stressed layer of material 134 positioned above the N-active regions 106 and the short P-active regions 108 across the product 100, while leaving the compressive-stressed layer of material 134 in place above the various long P-active regions 110 on the product 100. Thereafter, the patterned etch mask 136 was removed. At that point, the product may be completed by performing traditional manufacturing techniques. For example, a layer of insulating material (not shown) may be blanket-deposited so as to over-fill the spaces 140, 142 with insulating material and thereafter a CMP process may be performed on the layer of insulating material. Note that, with reference to FIG. 20, due to the formation of the trenches 112T, the bottom 130X of the tensile-stressed layer of material 130 is located at a level that is below the level of the bottom surface 122 of the active regions 106, 108 and 110. Similarly, with reference to FIG. 21, due to the formation of the trenches 112T, the bottom 134X of the compressive-stressed layer of material 134 is also located at a level that is below the level of the bottom surface 122 of the active regions 106, 108 and 110. With respect to FIG. 20, with respect to the two isolation structures 112 positioned on opposite sides of the short P-active region 108, portions of the isolation structures 112 are positioned laterally between the side surfaces 108X and 108Y of the short P-active region 108 and the tensile-stressed layer of material 130. Similarly, as shown in FIG. 21, portions of the isolation structures 112 positioned on opposite sides of the long P-active region 110 are laterally between the side surfaces 110X, 110Y of the long P-active region 110 and the compressive-stressed layer of material 134.

It should be noted that in the illustrative process flow depicted herein, the tensile-stressed layer of material 130 was initially formed across the entire substrate followed by removing portions of the tensile-stressed layer of material 130 positioned above the long P-active region 110. Thereafter, the compressive-stressed layer of material 134 was formed above the long P-active region 110 and portions of the compressive-stressed layer of material 134 positioned above the short P-active region 108 and the N-active region 106 were then removed. However, as will be appreciated by those skilled in the art after a complete reading of the present application, the process flow could be reversed if desired. For example, in another illustrative process flow, the compressive-stressed layer of material 134 may be initially formed across the entire substrate followed by removing portions of the compressive-stressed layer of material 134 positioned above the short P-active region 108 and the N-active region 106. Thereafter, the tensile-stressed layer of material 130 could be formed above the short P-active region 108 and the N-active region 106 and portions of the tensile-stressed layer of material 130 positioned above the long P-active region 110 could be removed.

Specifically note that, unlike various prior art process flows, the tensile-stressed layer of material 130 will remain in position in the final product 100 above the PFET transistors 116 formed on the short P-active region 108 while the compressive-stressed layer of material 134 will remain in position in the final product 100 above the PFET transistors 116 formed on the long P-active region 110. Simulations run by the inventors have shown that formation of the tensile-stressed layer of material 130 above the PFET transistors 116 formed on the shorter P-active region 108 results in an improvement of the performance of those transistors as compared to the formation of a compressive-stressed layer of material on the devices formed in the shorter P-active region 108. Conversely, the PFET transistors 116 formed on the longer P-active region 110 exhibited better performance when the compressive-stressed layer of material 134 was formed above those devices as compared to the formation of a tensile-stressed layer of material on those devices. It is believed that the process steps involved between FIGS. 1 and 21 may be responsible for the loss or reduction of desired stress levels in the short P-active region 108. However, simulation results show that the desirable mobility of holes in the short P-active region 108 may be restored or increased by the formation of the tensile-stressed layer of material 130 above the short P-active region 108.

With reference to FIGS. 20 and 21, various novel integrated circuit products are disclosed herein. For example, with reference to that area around the short P-active region 108 and the two isolation structures 112 formed on each side of the P-active region 108, the product 100 includes a first isolation structure 112 positioned adjacent the first side edge 108X of the first P-active region, wherein a first portion of the first isolation structure is positioned laterally between the first side edge 108X and a first portion of the tensile-stressed layer of material 130, and a second isolation structure 112 positioned adjacent the second side edge 108Y of the first P-active region 108, wherein a first portion of the second isolation structure is positioned laterally between the second side edge 108Y and a second portion of the tensile-stressed layer of material 130.

As another example, the product may also include a first trench 112T first formed in the first isolation structure wherein the first trench includes a first bottom surface, and a second trench formed in the second isolation structure, wherein the second trench includes a second bottom surface. In this example, a first portion of the tensile-stressed layer of material 130 has a surface 130X that engages the first bottom surface of the first trench and a second portion of the tensile-stressed layer of material has a second surface 130Y that engages the second bottom surface of the second trench.

With respect to the area of the isolation structure 112 positioned between the short P-active region 108 and the long P-active region 110, the product includes a first isolation structure 112 positioned adjacent the first side edge 108Y of the short P-active region 108 and a second side edge 110X of the long P-active region 110, wherein a first portion of the first isolation structure 112 is positioned laterally between the first side edge 108Y and the tensile-stressed layer of material and a second portion of the first isolation structure 112 is positioned laterally between the second side edge 110X and the compressive-stressed layer of material 134. In a further example, the tensile-stressed layer of material has a lowermost surface 130Y that is positioned at a level that is below a level of a bottom surface of the short P-active region 108 and the compressive-stressed layer of material 134 has a lowermost surface 134X that is positioned at a level that is below a level of a bottom surface of the long P-active region 110. In yet a further embodiment, a trench 112T is formed in the isolation structure 112 and a portion 130Y of the tensile-stressed layer of material 130 and a portion 134X of the compressive-stressed layer of material 134 both engage a bottom surface of the trench. Of course, other embodiments of the presently disclosed invention will be appreciated and understood by those skilled in the art after a complete reading of the present application.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a base semiconductor substrate;
   a buried insulation layer positioned above said base semiconductor layer;
   first and second spaced-apart P-active regions positioned above at least a portion of said buried insulation layer, said first and second spaced-apart P-active regions being electrically isolated from one another;
   at least one first PFET transistor positioned in said first P-active region, said at least one PFET transistor having a gate length that extends in a gate length direction;
   a plurality of second PFET transistors positioned in said second P-active region, wherein said first P-active region has a first length in said gate length direction and said second P-active region has a second length in said gate length direction, wherein said second length is greater than said first length and wherein the number of said second PFET transistors is greater than the number of said first PFET transistors;
   a tensile-stressed layer of material positioned on said at least one first PFET transistor and above said first P-active region; and
   a compressive-stressed layer of material positioned on said plurality of second PFET transistors and above said second P-active region.

2. The integrated circuit product of claim 1, further comprising a first isolation structure positioned adjacent a first side edge of said first P-active region and a second side edge of said second P-active region, wherein a first portion of said first isolation structure is positioned laterally between said first side edge and said tensile-stressed layer of material and a second portion of said first isolation structure is positioned laterally between said second side edge and said compressive-stressed layer of material.

3. The integrated circuit product of claim 2, wherein said tensile-stressed layer of material has a lowermost surface that is positioned at a level that is below a level of a bottom surface of said first P-active region and wherein said compressive-stressed layer of material has a lowermost surface that is positioned at a level that is below a level of a bottom surface of said second P-active region.

4. The integrated circuit product of claim 2, further comprising a trench formed in said isolation structure, wherein a portion of said tensile-stressed layer of material and a portion of said compressive-stressed layer of material both engage a bottom surface of said trench.

5. The integrated circuit product of claim 4, wherein said at least one first PFET transistor comprises at most six first PFET transistors, wherein said plurality of second PFET transistors comprises at least seven second PFET transistors, wherein said first and second PFET transistors are planar transistor devices and wherein said first length of said first P-active region is 200 nm or less.

6. The integrated circuit product of claim 1, wherein said at least one first PFET transistor and said plurality of second PFET transistors are substantially identical to one another, wherein said tensile-stressed layer of material comprises silicon nitride, said compressive-stressed layer of material comprises silicon nitride, said buried insulation layer comprises silicon dioxide, said base semiconductor substrate comprises silicon, said first P-active region comprises silicon-germanium and said second P-active region comprises silicon-germanium, wherein the germanium concentration of said silicon-germanium material in both said first and second P-active regions is substantially the same.

7. The integrated circuit product of claim 1, further comprising:
   an N-active region positioned above another portion of said buried insulation layer, said N-active region being electrically isolated from said first and second spaced-apart P-active regions; and
   at least one NFET transistor positioned in said N-active region, wherein said tensile-stressed layer of material is positioned on said at least one NFET transistor and above said N-active region.

8. The integrated circuit product of claim 7, further comprising a second isolation structure positioned adjacent said first side edge of said first P-active region and a third side edge of said N-active region, wherein a first portion of said second isolation structure is positioned laterally between said first side edge and said tensile-stressed layer of material and a second portion of said second isolation structure is positioned laterally between said third side edge and said tensile-stressed layer of material.

9. The integrated circuit product of claim 1, further comprising:
   a first isolation structure positioned adjacent a first side edge of said first P-active region, wherein a first portion of said first isolation structure is positioned laterally between said first side edge and a first portion of said tensile-stressed layer of material; and
   a second isolation structure positioned adjacent a second side edge of said first P-active region, wherein a first portion of said second isolation structure is positioned laterally between said second side edge and a second portion of said tensile-stressed layer of material.

10. The integrated circuit product of claim 9, further comprising:
    a first trench formed in said first isolation structure, said first trench having a first bottom surface; and
    a second trench formed in said second isolation structure, said second trench having a second bottom surface, wherein a first portion of said tensile-stressed layer of material engages said first bottom surface of said first trench and a second portion of said tensile-stressed layer of material engages said second bottom surface of said second trench.

11. The integrated circuit product of claim 10, wherein said first bottom surface of said first trench is positioned at a level that is below a level of a bottom surface of said first P-active region and said second bottom surface of said second trench is positioned at a level that is below said level of said bottom surface of said first P-active region.

12. An integrated circuit product, comprising:
    a base semiconductor substrate;
    a buried insulation layer positioned above said base semiconductor layer;
    first and second spaced-apart P-active regions positioned above at least a portion of said buried insulation layer, said first and second spaced-apart P-active regions being electrically isolated from one another;
    a plurality of first PFET transistors positioned in said first P-active region, each of said plurality of first PFET transistors having a gate length that extends in a gate length direction;
    a plurality of second PFET transistors positioned in said second P-active region, wherein said first P-active region has a first length in said gate length direction and said second P-active region has a second length in said gate length direction, wherein said second length is greater than said first length and wherein the number of said plurality of second PFET transistors is greater than the number of said plurality of first PFET transistors;
    a first isolation structure positioned adjacent a first side edge of said first P-active region;
    a first trench first formed in said first isolation structure, said first trench having a first bottom surface;
    a second isolation structure positioned adjacent a second side edge of said first P-active region;
    a second trench formed in said second isolation structure, said second trench having a second bottom surface;
    a tensile-stressed layer of material positioned on said plurality of first PFET transistors and above said first P-active region, wherein a first portion of said tensile-stressed layer of material engages said first bottom surface of said first trench and a second portion of said tensile-stressed layer of material engages said second bottom surface of said second trench; and
    a compressive-stressed layer of material positioned on said plurality of second PFET transistors and above said second P-active region.

13. The integrated circuit product of claim 12, wherein said first bottom surface of said first trench is positioned at a level that is below a level of a bottom surface of said first P-active region and said second bottom surface of said second trench is positioned at a level that is below said level of said bottom surface of said first P-active region.

14. A method, comprising:
    forming first and second spaced-apart P-active regions;
    forming at least one first PFET transistor in said first P-active region, said at least one PFET transistor having a gate length that extends in a gate length direction;
    forming a plurality of second PFET transistors in said second P-active region, wherein said first P-active region has a first length in said gate length direction and said second P-active region has a second length in said gate length direction, wherein said second length is greater than said first length and wherein the number of second PFET transistors is greater than the number of first PFET transistors;
    forming a tensile-stressed layer of material on said at least one first PFET transistor and above said first P-active region; and
    forming a compressive-stressed layer of material on said plurality of second PFET transistors and above said second P-active region.

15. The method of claim 14, wherein said tensile-stressed layer of material is formed prior to forming said compressive-stressed layer of material.

16. The method of claim 14, further comprising:
    forming a first isolation structure adjacent a first side edge of said first P-active region;
    forming a first trench in said first isolation structure, said first trench having a first bottom surface;
    forming a second isolation structure positioned adjacent a second side edge of said first P-active region;
    forming a second trench in said second isolation structure, said second trench having a second bottom surface, wherein forming said tensile-stressed layer of material comprises forming said tensile-stressed layer of material such that a first portion of said tensile-stressed layer of material engages said first bottom surface of said first trench and a second portion of said tensile-stressed layer of material engages said second bottom surface of said second trench.

17. The method of claim 16, wherein forming said first trench comprises forming said first trench such that said first bottom surface of said first trench is positioned at a level that is below a level of a bottom surface of said first P-active region and forming said second trench comprises forming said second trench such that said second bottom surface of said second trench is positioned at a level that is below said level of said bottom surface of said first P-active region.

18. The method of claim 14, wherein forming said at least one first PFET transistor comprises forming at most six PFET transistors, wherein forming said plurality of second PFET transistors comprises forming at least seven second PFET transistors, wherein said first and second PFET transistors are planar transistor devices and wherein said first length of said first P-active region is 200 nm or less.

19. The method of claim 14, wherein forming said first and second spaced-apart P-active regions comprises forming said first P-active region such that said first length is 200 nm or less and forming said second P-active region such that said second length is at least 210 nm.

20. The method of claim 14. wherein forming said first and second spaced-apart P-active regions comprises forming first and second spaced-apart P-active silicon-germanium regions.

* * * * *